United States Patent
Miyazawa

(10) Patent No.: US 9,484,873 B2
(45) Date of Patent: Nov. 1, 2016

(54) DIFFERENTIAL AMPLIFIER CIRCUIT

(71) Applicant: FUJI ELECTRIC CO., LTD., Kawasaki-shi (JP)

(72) Inventor: Shigemi Miyazawa, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 146 days.

(21) Appl. No.: 14/301,732

(22) Filed: Jun. 11, 2014

(65) Prior Publication Data

US 2014/0375385 A1 Dec. 25, 2014

(30) Foreign Application Priority Data

Jun. 20, 2013 (JP) ................................. 2013-129081

(51) Int. Cl.
*H03F 3/45* (2006.01)
*H03F 1/02* (2006.01)

(52) U.S. Cl.
CPC ......... *H03F 3/45183* (2013.01); *H03F 1/0211* (2013.01); *H03F 2200/411* (2013.01); *H03F 2200/516* (2013.01)

(58) Field of Classification Search
CPC ............... H03F 1/0244; H03F 1/0211; H03F 2200/504; H03F 1/0227; H03F 1/0222; H03F 1/06; H03F 1/08; H03G 3/22; H03G 3/3042; B60D 1/00
USPC ......................................... 330/137, 297, 127
See application file for complete search history.

(56) References Cited

U.S. PATENT DOCUMENTS

| | | | | |
|---|---|---|---|---|
| 5,880,638 A * | 3/1999 | Schaffer | ................ | H03F 3/3001 330/253 |
| 6,011,440 A * | 1/2000 | Bell | ........................ | H03L 7/093 330/297 |
| 7,764,113 B2 * | 7/2010 | Ryu | ...................... | H03F 1/0211 327/540 |
| 7,956,676 B2 * | 6/2011 | Noda | ...................... | G05F 1/565 327/540 |
| 8,212,620 B2 * | 7/2012 | Strickland | ............. | H03F 1/0211 330/297 |

FOREIGN PATENT DOCUMENTS

JP 2007-109034 A 4/2007

* cited by examiner

*Primary Examiner* — Khanh V Nguyen
(74) *Attorney, Agent, or Firm* — Rossi Kimms & McDowell LLP

(57) ABSTRACT

Aspects of the invention include a differential amplifier circuit with a differential amplifier operated with a first power supply voltage applied thereto to amplify a differential voltage between paired input voltages, an inverting amplifier operated with a second power supply voltage applied thereto to carry out inverting amplification of the output of the differential amplifier and output the amplified output to the outside, and a voltage step-up circuit producing the first power supply voltage higher than the second power supply voltage from the second power supply voltage and applying the produced first power supply voltage to the differential amplifier. This satisfies at one time the requirement for producing the high power supply voltage necessary for the differential amplifier and the requirement for securing the power supply current necessary for the inverting amplifier on the basis of the externally supplied second power supply voltage.

5 Claims, 6 Drawing Sheets

DIFFERENTIAL AMPLIFIER CIRCUIT

CROSS-REFERENCE TO RELATED APPLICATION

This application is based on, and claims priority to, Japanese Patent Application No. 2013-129081, filed on Jun. 20, 2013. The disclosure of the priority application, in its entirety, including the drawings, claims, and the specification thereof, is incorporated herein by reference.

BACKGROUND OF INVENTION

1. Field of the Invention

Embodiments of the invention relates to differential amplifier circuits stably operated by low power supply voltages.

2. Related Art

A differential amplifier circuit is widely used as an element forming each of principal parts in various kinds of electronic circuits such as comparators and operational amplifiers, for example. Moreover, various kinds of low power supply voltage and low power consumption type differential amplifier circuits have been recently developed which are mounted in electronic devices in vehicles or ships for being used for detecting various kinds of information from sensors. As is shown in FIG. 4, a diagram schematically showing an example of the configuration of a related differential amplifier circuit, a differential amplifier circuit 1 of this kind is formed with a differential amplifier 2 and an inverting amplifier 3 provided. The differential amplifier 2 amplifies the differential voltage of paired input voltages and the inverting amplifier 3 carries out inverting amplification of the output of the differential amplifier 2 and externally outputs the output subjected to the inverting amplification.

The differential amplifier 2, as is shown in, for example, FIG. 5, a diagram showing an example of the configuration of the differential amplifier 2 in the differential amplifier circuit 1 shown in FIG. 4, is provided with MOS-FETs 2a and 2b as a first and second transistors, respectively, forming a differential pair and MOS-FETs 2c and 2d as a third and fourth transistors forming the loads of the MOS-FETs 2a and 2b, respectively. The differential amplifier 2 is further formed with a MOS-FET 2e as a fifth transistor provided which forms the current source of the differential pair. See Japanese Patent Application Publication No. JP-A-2007-109034).

Specifically, the MOS-FETs 2a and 2b are formed of n-channel enhancement mode MOS-FETs to the drains of which the MOS-FETs 2c and 2d are connected, respectively. Along with this, the sources of the MOS-FETs 2a and 2b are connected to each other, by which a differential pair is formed in which the MOS-FETs 2a and 2b have their gates provided as a pair of signal input terminals IN1 and IN2, respectively. Moreover, the MOS-FETs 2c and 2d forming the loads of the MOS-FETs 2a and 2b, respectively, are formed of n-channel depletion mode MOS-FETs and are provided with the sources thereof connected to their respective gates and, along with this, with each of the drains thereof connected to a power supply terminal +V on the positive side. In addition, the MOS-FET 2e is formed of an n-channel enhancement mode MOS-FET having the drain thereof connected to the sources of the MOS-FETs 2a and 2b and, along with this, having the source thereof connected to a power supply terminal −V on the negative side and being operated as a constant current source with a specified bias voltage VG applied to the gate thereof.

The bias voltage VG applied to the gate of the MOS-FET 2e is established so that a saturation current flowing between the drain and the source of the MOS-FET 2e becomes a little larger than a current flowing between the drain and the source of each of the MOS-FETs 2c and 2d, on the order of 1.5 times, for example.

The inverting amplifier 3, as is shown in FIG. 6, a diagram showing an example of the configuration of the inverting amplifier 3 in the differential amplifier circuit 1 shown in FIG. 4, for example, is formed with a MOS-FET 3b as a seventh transistor with a MOS-FET 3a as a sixth transistor provided as a load. The MOS-FET 3a forming the load is formed of an n-channel depletion mode MOS-FET and is provided with the source thereof connected to the gate thereof and, along with this, with the drain thereof connected to a power supply terminal +V on the positive side. The MOS-FET 3b is formed of an n-channel enhancement mode MOS-FET, for example, and is provided with the drain thereof having the source and the gate of the MOS-FET 3a connected thereto and, along with this, with the source connected to the power supply terminal −V on the negative side. In addition, the MOS-FET 3b carries out an inverting operation with the gate thereof receiving an output signal from the differential amplifier 2 and outputs the drain voltage thereof to the outside as an output voltage approximately equal to the power supply voltage Vdd or equal to zero level.

Here, the case will be considered in which the differential amplifier circuit 1 is used as a comparator with a reference voltage Vref is set at the signal input terminal IN2 of the differential amplifier circuit 1 and an input voltage Vin given to the signal input terminal IN1 of the differential amplifier circuit 1. When the relationship between the input voltage Vin and the reference voltage Vref is given as Vin>Vref, it is required for turning-off the MOS-FET 2b in the differential amplifier 2 shown in FIG. 5 that the drain-source voltage Vds(e) of the MOS-FET 2e and the operating threshold voltage Vth(b) of the MOS-FET 2b satisfy the condition with respect to the reference voltage Vref as $$Vds(e) > Vref - Vth(b). \tag{1}$$

The condition that an output voltage Vout outputted from an output terminal OUT2 of the differential amplifier 2 becomes the closest to a voltage V(−) applied to the power supply terminal −V on the negative side is that the drain-source voltage Vds(c) of the MOS-FET 2c is equal to or more than the pinch-off voltage to cause the region between the drain and the source of the MOS-FET 2c to be in a pinched-off state. The pinch-off condition is shown as the relationship between the drain-source voltage of Vds(c) of the MOS-FET 2c and the operating threshold voltage Vth(c) of the MOS-FET 2c as $$Vds(c) > -Vth(c). \tag{2}$$

Therefore, the power supply voltage Vcc of the differential amplifier circuit 1 (i.e. the differential amplifier 2) satisfying the conditions given by the expressions (1) and (2) is required to satisfy the following condition when letting a voltage applied to the power supply terminal +V on the positive side be V(+) and a voltage applied to the power supply terminal −V on the negative side be V(−):

$$Vcc = V(+) - V(-) > Vds(e) + \{-Vds(c)\},$$

that is, $$Vcc > Vref - Vth(b) - Vth(c). \tag{3}$$

Specifically, when the operating threshold voltage Vth(b) of the MOS-FET 2b is 1V, the operating threshold voltage Vth(c) of the MOS-FET 2c is −2V, and the reference voltage Vref is set at 1.5V, the power supply voltage Vcc required for driving the differential amplifier 2 is obtained from the expression (3) as being 2.5V or more as a necessary condition.

While, in the inverting amplifier 3, when the voltage applied to the gate of the MOS-FET 3b (the output voltage Vout of the differential amplifier 2) shown in FIG. 6 is larger than the operating threshold voltage Vth(b) of the MOS-FET 3b, it is desirable that the drain-source voltage Vds(a) of the MOS-FET 3a is that in a pinched-off state. The pinched-off condition is shown as the relationship between the drain-source voltage Vds(a) of the MOS-FET 3a and the operating threshold voltage Vth(a) of the MOS-FET 3a as $$Vds(a) > -Vth(a). \quad (4)$$

The power supply voltage Vdd of the inverting amplifier 3 is required to satisfy the following condition when letting a voltage applied to the power supply terminal +V on the positive side be V(+) and a voltage applied to the power supply terminal −V on the negative side be V(−):

$$Vdd = V(+) - V(-) > Vds(a),$$

that is, $$Vdd > -Vth(a). \quad (3)$$

Thus, when the operating voltages Vth(c), Vth(d) and Vth(a) of the MOS-FETs 2c, 2d and 3a, respectively, are assumed to be equal to one another, the power supply voltage Vcc of the differential amplifier 2 is required to be higher than the power supply voltage Vdd required for the inverting amplifier 3 by Vref−Vth(b) or more.

In the differential amplifier 2 in the differential amplifier circuit 1, currents flowing therein are only drain-source currents of the MOS-FETs 2c and 2d each being in the order of microamperes with very small current consumption. In the inverting amplifier 3, however, a current flows also in the load (not shown) connected to the output terminal OUT thereof. Therefore, when the power supply voltage Vdd of the inverting amplifier 3 is 3V and the value of the load thereof is 10 kΩ, for example, a current as much as 300 µA flows in the inverting amplifier 3.

Thus, for reducing the current consumption with the conditions for the power supply voltages for the differential amplifier 2 and the inverting amplifier 3 explained in the foregoing satisfied and with the condition for the output current for the inverting amplifier 3 satisfied, it becomes necessary to provide an independent power supply system for each of the differential amplifier 2 and the inverting amplifier 3. To provide two power supply systems for the differential amplifier circuit 1 of this kind, however, not only impairs the general versatility thereof but also becomes a cause of worsening the ease of operation thereof.

SUMMARY OF THE INVENTION

Embodiments of the invention provide a differential amplifier circuit with a simple configuration which circuit is able to secure a power supply voltage necessary for the differential amplifier and a power supply current necessary for the inverting amplifier simultaneously and easily and to be operated stably with a low power supply voltage.

Some embodiments can include a differential amplifier circuit including:

a differential amplifier operated with a first power supply voltage matched with the voltage levels of paired input voltages applied thereto to amplify the differential voltage between the paired input voltages;

an inverting amplifier operated with an externally supplied second power supply voltage applied thereto to carry out inverting amplification of the output of the differential amplifier and output the amplified output to the outside with a specified output current margin; and further, a voltage step-up circuit producing the first power supply voltage higher than the second power supply voltage from the second power supply voltage and applying the produced first power supply voltage to the differential amplifier.

The voltage step-up circuit is preferably formed by including an oscillator receiving the second power supply voltage to carry out an oscillating operation, and a charge-pumping circuit receiving the output of the oscillator to produce the first power supply voltage from the second power supply voltage.

Here, the oscillator is actualized as a ring oscillator formed of, for example, odd numbers of three or more logical inverter circuits connected in series in a loop and carrying out an oscillation operation with the use of the signal transfer characteristic accompanied by the delay in the operation response of each of the logical inverter circuits.

Moreover, the charge-pumping circuit is formed so as to include, for example, a logical inverter circuit having the second power supply voltage applied thereto and carrying out repetitive inverting operations which invert the output of the oscillator to repeatedly output voltages each being approximately equal to the second power supply voltage, a first capacitor the one end of which is connected to the output end of the logical inverter circuit, a first diode the cathode of which is connected to the other end of the first capacitor to apply the second power supply voltage thereto to make the first capacitor charged to have the voltage across the first capacitor approximately equal to the second power supply voltage, a second diode the anode of which is connected to the connection point of the other end of the first capacitor and the first diode, and a second capacitor the one end of which is connected to the cathode of the second diode and the other end of which is connected to the ground.

In the charge-pumping circuit with the foregoing configuration, with the repetitive inverting operations of the logical inverter circuit, the first capacitor, the one end of which is connected to the output end of the logical inverter circuit, repeatedly transmits a voltage, approximately two times the second power supply voltage with the output voltages of the logical inverter circuit repeatedly added to the voltage across the charged first capacitor, from the other end thereof to the second capacitor through the second diode, and the second capacitor has the voltage approximately two times the second power supply voltage applied to the one end thereof to be repeatedly charged and produces the voltage approximately two times the second power supply voltage across the second capacitor based on the charging as the first power supply voltage.

The differential amplifier is preferably formed by including, for example, a first transistor forming one of a differential pair to which one of the paired input voltages is inputted, a second transistor forming the other one of the differential pair to which the other one of the paired input voltages is inputted, a third transistor forming the load of the first transistor, a fourth transistor forming the load of the second transistor, and a fifth transistor forming the current source of the differential pair. Specifically, it is preferable that each of the first and second transistors forming the differential pair and the fifth transistor is actualized as an n-channel enhancement mode MOS-FET and each of the third and fourth transistors is actualized as an n-channel depletion mode MOSFET.

According to the differential amplifier circuit with the foregoing configuration, the inverting amplifier is operated with the externally supplied second power supply voltage applied thereto and the differential amplifier is operated with the first power supply voltage applied thereto to which the second power supply voltage is multiplied in the voltage step-up circuit. Therefore, the differential amplifier is to be operated by receiving a power supply voltage (first power supply voltage) higher than the power supply voltage applied to the inverting amplifier to make it possible to carry out the differential amplification of an input signal under the voltage condition explained in the foregoing. Moreover, the inverting amplifier, operated with the externally supplied second power supply voltage applied thereto, makes it possible to sufficiently secure the output current thereof.

In addition, by forming the voltage step-up circuit with, for example, the oscillator formed of the ring oscillator and the charge-pumping circuit receiving the output of the oscillator to multiply the second power supply voltage, the first power supply voltage necessary for driving the differential amplifier can be produced simply and efficiently. In particular, the oscillator and the charge-pumping circuit can be formed by using the logical inverter circuits having the same configurations as those of the inverting amplifiers, for example. Therefore, this is suited to make up an integrated circuit of the differential amplifier circuit into which the differential amplifier and the inverting amplifier are integrated with the oscillator and the charge-pumping circuit included, by which a big practical advantage is provided.

DETAILED DESCRIPTION

Embodiments of the invention are explained with reference to attached drawings.

Figure 1:
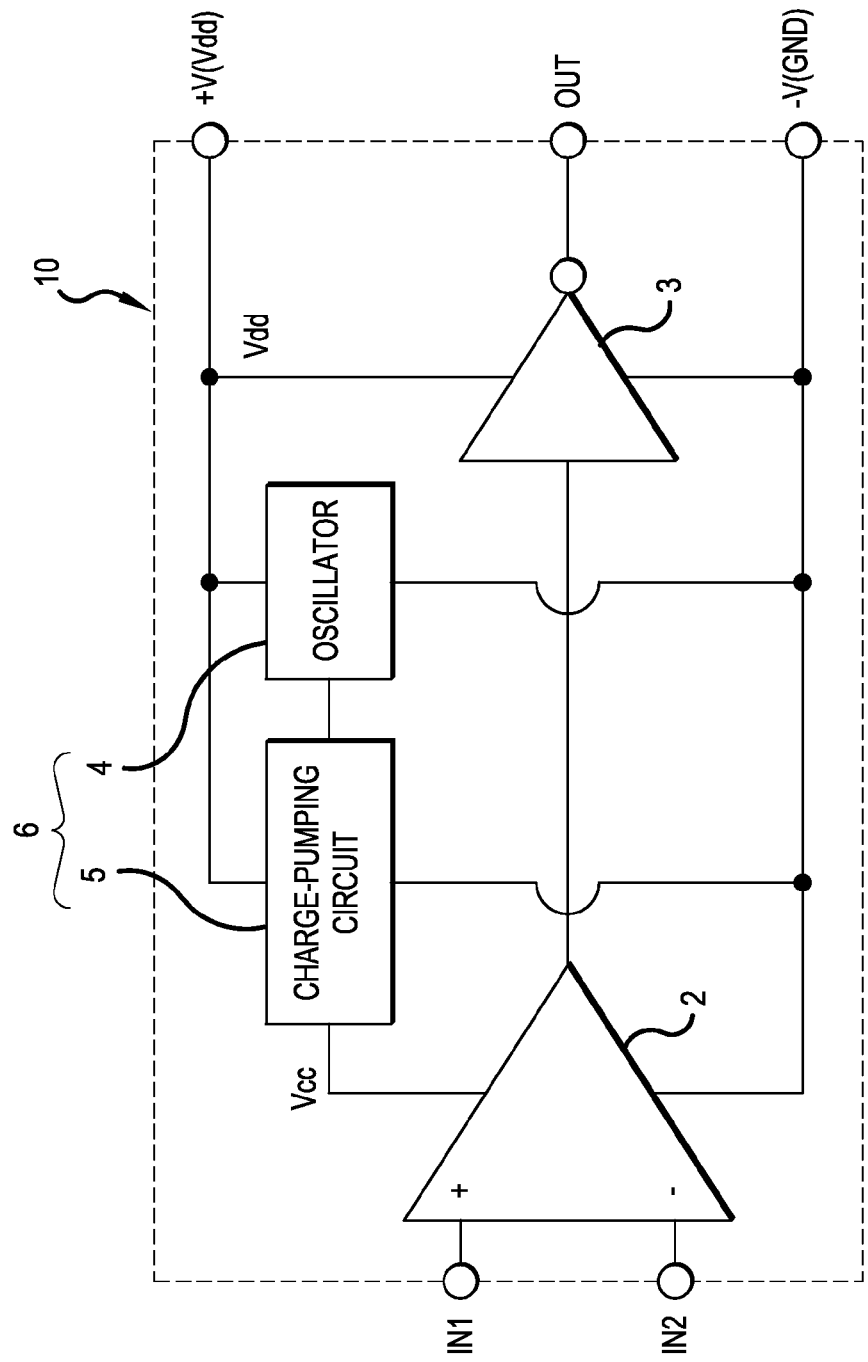
FIG. 1 is a diagram schematically showing the configuration of a differential amplifier circuit 10 according to an embodiment of the invention.
Figure 4:
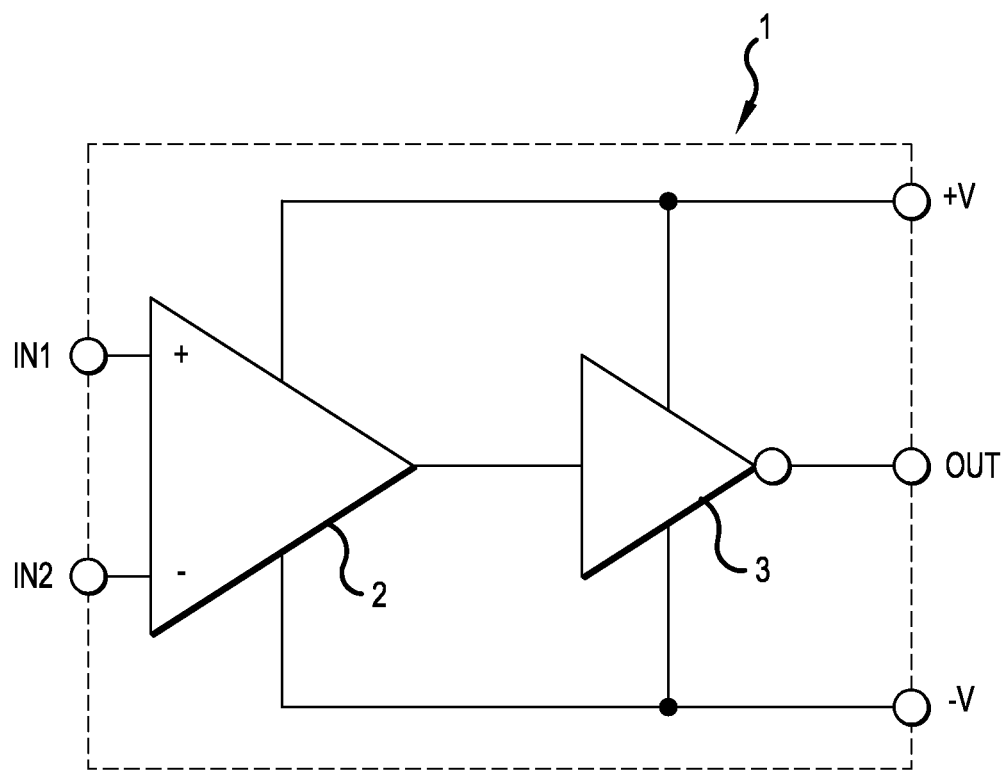
FIG. 4 is a diagram schematically showing an example of the configuration of a related differential amplifier circuit.

FIG. 1 is a diagram schematically showing the configuration of a differential amplifier circuit 10 according to an embodiment of the invention, in which diagram the same parts as those in the related differential amplifier 1 shown in FIG. 4 are shown while being denoted with the same reference numerals and signs. Therefore, repetition of explanations on the same parts will be omitted. The differential amplifier circuit 10 is characterized by the provision of an oscillator 4 and a charge-pumping circuit 5 in addition to the differential amplifier 2 and the inverting amplifier 3. The oscillator 4 and the charge-pumping circuit 5 form a voltage step-up circuit 6 which multiplies a power supply voltage applied between the power supply terminal +V on the positive side and the power supply terminal −V on the negative side of the differential amplifier circuit 10 to produce the power supply voltage required for the differential amplifier 2.

Namely, the power supply voltage Vdd fed between the power supply terminal +V on the positive side and the power supply terminal −V on the negative side is applied to the inverting amplifier 3 as a second power supply voltage driving the inverting amplifier 3. The power supply voltage Vdd is further applied to the oscillator 4 and the charge-pumping circuit 5 as a voltage for driving each of the oscillator 4 and the charge-pumping circuit 5. The voltage step-up circuit 6 formed of the oscillator 4 and the charge-pumping circuit 5 is formed so as to produce a power supply voltage Vcc (Vcc>Vdd) to which the power supply voltage Vdd is multiplied and is provided so that the power supply voltage Vcc is applied to the differential amplifier 2 as a first power supply voltage driving the differential amplifier 2.

Figure 2:
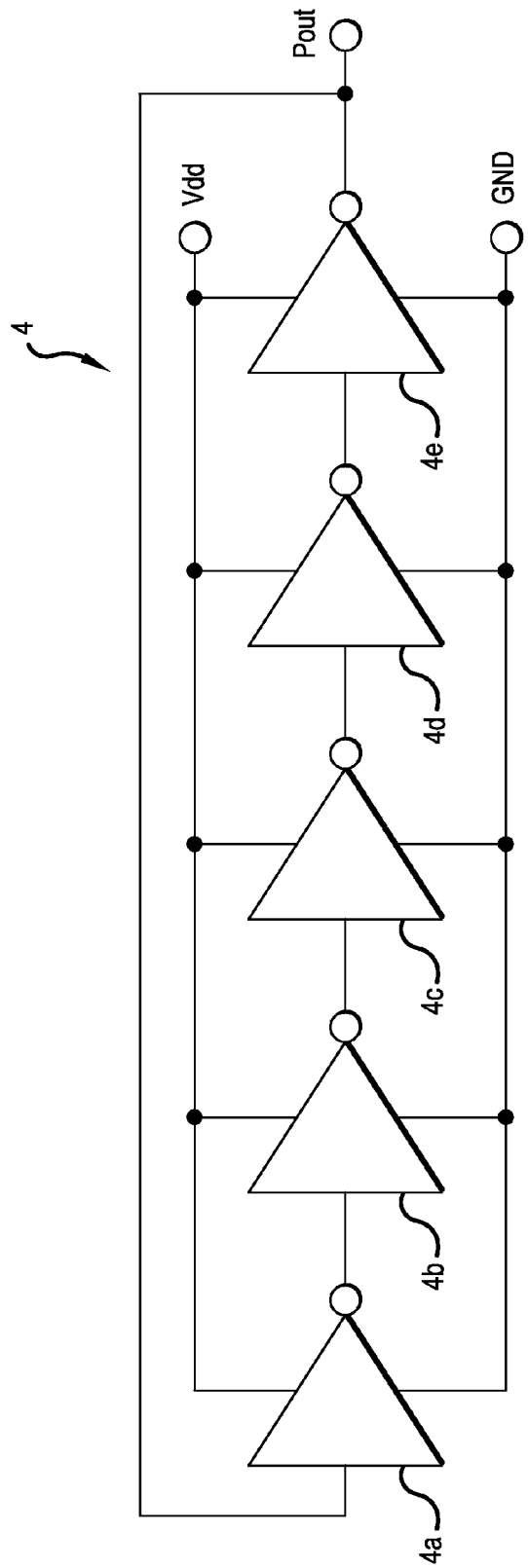
FIG. 2 is a diagram showing an example of the configuration of the oscillator in the differential amplifier circuit shown in FIG. 1.
Figure 6:
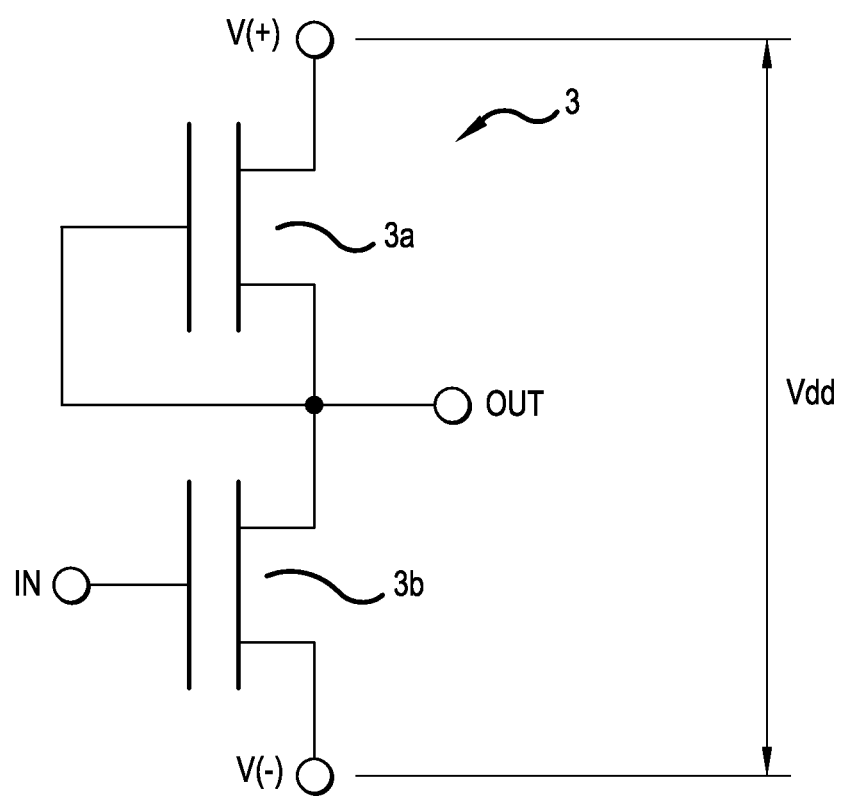
FIG. 6 is a diagram showing an example of the configuration of the inverting amplifier in the differential amplifier circuit shown in FIG. 4.

Here, the oscillator 4 is formed of a ring oscillator formed with odd numbers of three or more, for example, five logical inverter circuits 4a to 4e connected in series in a loop as is shown in FIG. 2 as a diagram showing an example of the configuration of the oscillator 4 in the differential amplifier circuit 10 shown in FIG. 1. The oscillator (ring oscillator) 4 is one which carries out an oscillation operation with the use of the signal transfer characteristic accompanied by its own delay in operation response of each of the logical inverter circuits 4a to 4e. Each of the logical inverter circuits 4a to 4e is actualized as a circuit formed substantially in the same way as that of forming the circuit of the inverting amplifier 3 shown in FIG. 6. Therefore, the oscillator 4, with the second power supply voltage Vdd applied thereto, carries out an oscillation operation with a frequency specified by the delay in operation response of each of the logical inverter circuits 4a to 4e. As an output Pout of the oscillation operation, pulse signals are obtained which are inverted at a specified period.

Figure 3:
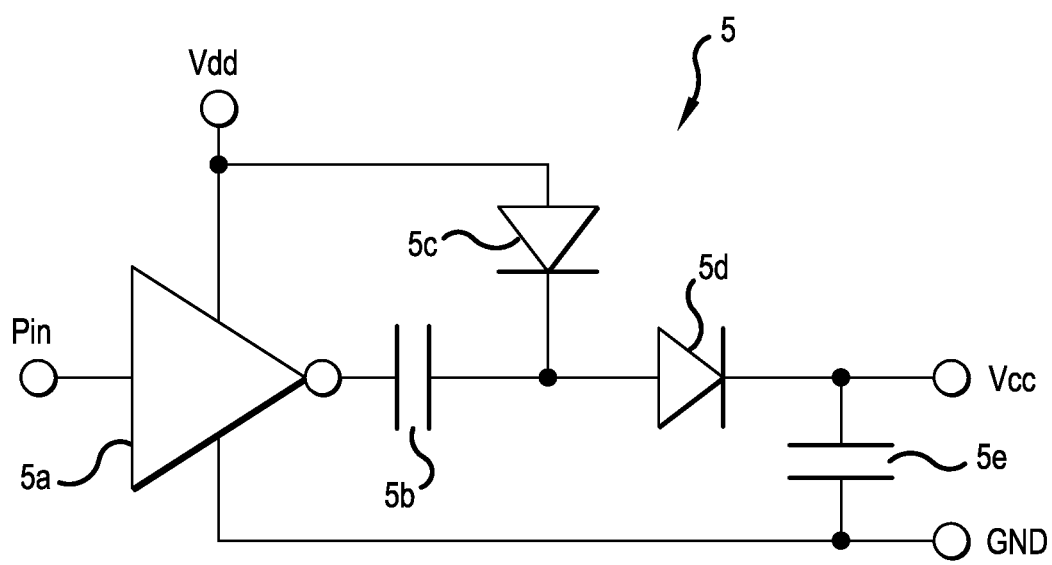
FIG. 3 is a diagram showing an example of the configuration of the charge-pumping circuit in the differential amplifier circuit shown in FIG. 1.

Compared with this, the charge-pumping circuit 5, as is shown in, for example, FIG. 3 as a diagram showing an example of the configuration of the charge-pumping circuit 5 in the differential amplifier circuit 10 shown in FIG. 1, includes a logical inverter circuit 5a, a first capacitor 5b and a first diode 5c. The logical inverter circuit 5a has the second power supply voltage Vdd applied thereto and carries out repetitive inverting operations which invert the pulse signals outputted from the oscillator 4 and repeatedly output inverted pulse signals with the voltage thereof approximately equal to the second power supply voltage Vdd. The first capacitor 5b is connected to the output end of the logical inverter circuit 5a with the one end thereof and the first diode 5c is connected to the other end of the first capacitor 5b with the cathode thereof for applying the second power supply voltage Vdd to the first capacitor 5b. The charge-pumping circuit 5 is formed by further including a second diode 5d and a second capacitor 5e. The second diode 5d is connected to the connection point of the other end of the first capacitor 5b and the first diode 5c with the anode thereof. The second capacitor 5e is connected to the cathode of the second diode 5d to be charged by the voltage at the other end of the first capacitor 5b transmitted therefrom through the second diode 5d. Incidentally, the logical inverter circuit 5a, similarly to each of the logical inverter circuits 4a to 4e, is actualized as a circuit formed substantially in the same way as that of the inverting amplifier 3 shown in FIG. 6, for example.

In the charge-pumping circuit 5 formed in this way, when the level of the pulse signal inputted to the logical inverter circuit 5a is a high H level, the level of the output voltage of the logical inverter circuit 5a becomes an L level at approximately zero level. This allows a voltage approximately equal to the second power supply voltage Vdd to be applied across the first capacitor 5b to the other end of which the second power supply voltage Vdd is applied through the first diode 5c, by which the first capacitor 5b is charged. Then, when the level of the pulse signal is inverted to the L level, the level of the output of the logical inverter circuit 5a becomes the H level which is approximately equal to the second power supply voltage Vdd. This brings the voltage at the other end of the first capacitor 5b to be a voltage which is provided with the voltage across the charged first capacitor 5b added to the output voltage of the logical inverter circuit 5a at the H level, i.e. a voltage approximately two times the second power supply voltage Vdd.

Although the voltage at the other end of the first capacitor 5b is higher than the second power supply voltage Vdd, a current flowing from the other end of the first capacitor 5b toward the power supply of the second power supply voltage Vdd is blocked by the first diode 5c. Hence, the voltage at the other end of the first capacitor 5b is transmitted to the second capacitor 5e through the second diode 5d as a voltage two times the second power supply voltage Vdd to be applied to the second capacitor 5e to charge it. When the level of the pulse signal inputted to the logical inverter circuit 5a becomes the H level again, the level of the output voltage of the logical inverter circuit 5a becomes the L level, by which the voltage at the other end of the first capacitor 5b returns to the previous state of being at the second power supply voltage Vdd. At this time, a current flowing from the second capacitor 5e toward the other end of the first capacitor 5b is blocked by the second diode 5d. With such repetitive inverting operations, the second capacitor 5e is repeatedly charged by the repetitive applications of the voltage approximately two times the second power supply voltage Vdd. The voltage across the second capacitor 5e due to the charging of the second capacitor 5e is outputted as the first power supply voltage Vcc which is produced by multiplying the second power supply voltage Vdd and applied to the differential amplifier 2.

Specifically, assuming that the output voltage of the logical inverter circuit 5a becomes zero when the output voltage is at the L level and becomes the second power supply voltage Vdd when the output voltage is at the H level and letting the forward drop voltage of each of the first diode 5c and the second diode 5d be Vf, the first power supply voltage Vcc as the output voltage of the charge-pumping circuit 5 becomes $$Vcc=2Vdd-2Vf.$$

Letting the second power supply voltage Vdd be 2V and the forward drop voltage Vf be 0.6V, for example, the first power supply voltage Vcc as the output voltage of the charge-pumping circuit 5 becomes as Vcc=2×2V−2×0.6V=2.8V, which becomes higher than the second power supply voltage Vdd by 0.8V.

Figure 5:
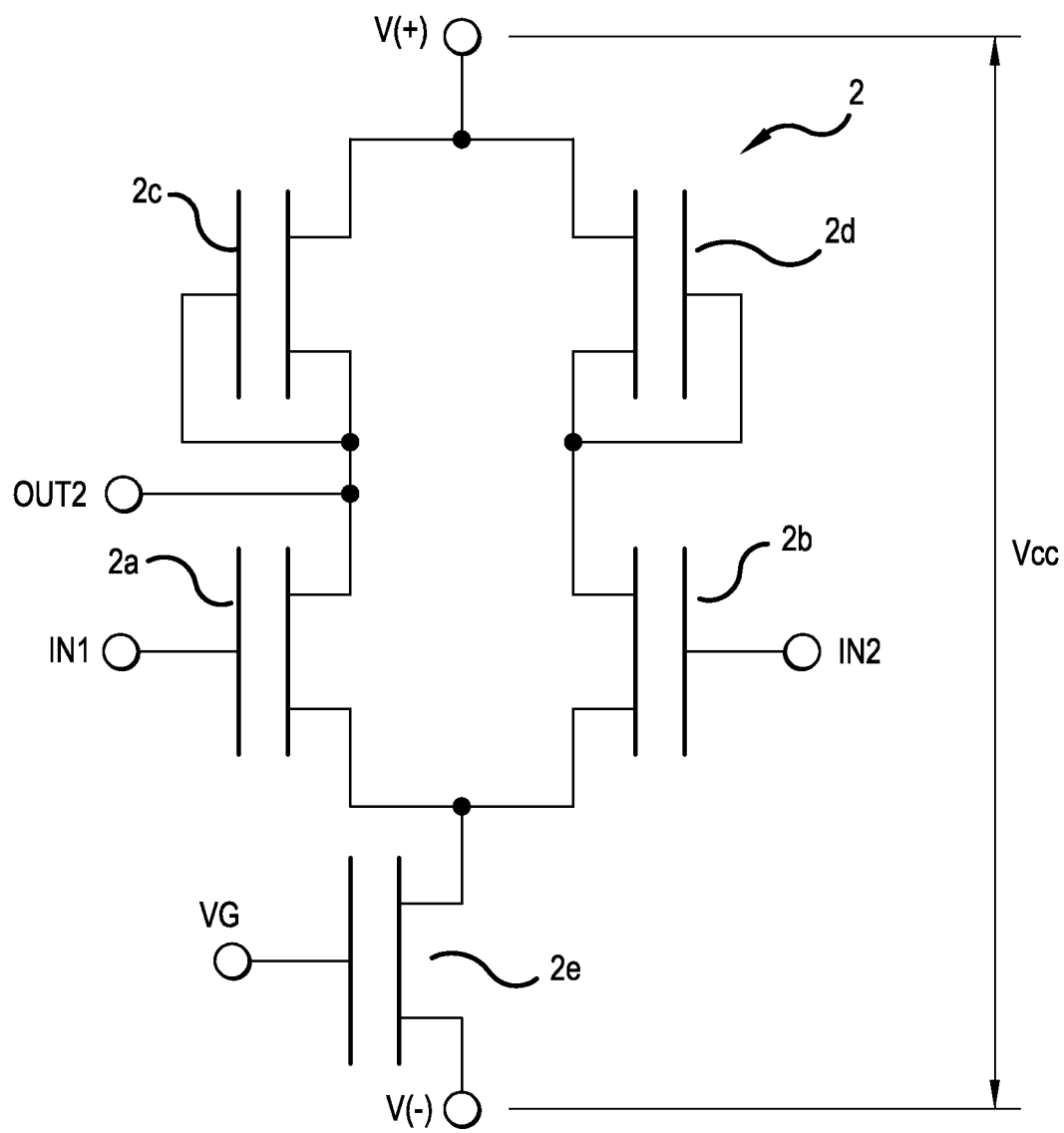
FIG. 5 is a diagram showing an example of the configuration of the differential amplifier in the differential amplifier circuit shown in FIG. 4.

Therefore, as is explained in the foregoing, letting the operating threshold voltage Vth(b) of the enhancement mode MOS-FET 2b be 1V and the operating threshold voltage Vth(c) of the depletion mode MOS-FET 2c be −2V in the differential amplifier 2 shown in FIG. 5, for example, a relationship can be derived from the expression (3) explained in the foregoing as $$2.8V>Vref-1V+2V.$$

Hence, in this case, the reference voltage Vref in this case becomes as $$1.8V>Vref.$$

This shows that the reference voltage Vref becomes capable of being set higher up to a voltage close to 1.8V.

Moreover, when the power supply voltage applied to the differential amplifier circuit 10 is the second power supply voltage Vdd, which is set as 2V, for example, the differential amplifier circuit 10 used as a comparator is to compare an input voltage Vin varying within the range from 0V to 2V with the reference voltage Vref. Therefore, the reference voltage Vref is desirably set at 1V as the intermediate voltage of the input voltage Vin or more. Therefore, when the condition of setting the reference voltage Vref explained in the foregoing (upper limit) is taken into consideration, the reference voltage Vref set within the range as $$1.8V>Vref>1V$$

makes it possible to assure the operation of the differential amplifier 2.

Thus, according to the differential amplifier circuit 10 formed as was explained in the foregoing, the power supply voltage Vdd applied to the differential amplifier circuit 10 is used as the second power supply voltage operating the inverting amplifier 3, the oscillator 4 and the charge-pumping circuit 5. Moreover, the power supply voltage Vcc produced by multiplying the second power supply voltage Vdd in the charge-pumping circuit 5 is used as the first power supply voltage.

Accordingly, the first power supply voltage Vcc for the differential amplifier 2 can be set higher than the second power supply voltage Vdd for the inverting amplifier 3, by which a stable operation of the differential amplifier 2 becomes possible even when the second power supply voltage Vdd supplied to the differential amplifier circuit 10 is low. In addition, the first power supply voltage Vcc can be easily produced in the voltage step-up circuit 6 provided in the differential amplifier circuit 10 so as to include the oscillator 4 and the charge-pumping circuit 5.

In particular, the inverting amplifier 3, using directly the externally supplied second power supply voltage Vdd as the power supply voltage for the inverting amplifier 3, easily secures the sufficient output current thereof. In addition, the differential amplifier 2 in itself which is operated by the voltage multiplied by the voltage step-up circuit 6, having a small current consumption with a current in the order of microamperes, easily has the required operating current provided by the output current of the voltage step-up circuit 6. Therefore, it becomes possible to satisfy the requirements for the power supply at one time with a simple configuration which requirements are for driving the differential amplifier 2 with a voltage higher than the voltage of driving the inverting amplifier 3 and, along with this, for sufficiently securing the output current necessary for the inverting amplifier 3.

The oscillator 4 and the charge-pumping circuit 5 can be formed by using the logical inverter circuits 4a to 4e and the logical inverter circuit 5a, respectively, each being formed substantially in the same way as that of forming the inverting amplifier 3. Therefore, the differential amplifier circuit 10, although it is provided with the voltage step-up circuit 6 formed of the oscillator 4 and the charge-pumping circuit 5 in addition to the differential amplifier 2 and the inverting amplifier 3, is less burdensome in being formed as an integrated circuit including them, by which the integrated circuit can be brought into realization at a low cost. Therefore, the differential amplifier circuit 10 has great practical advantages.

The invention is not limited to the embodiment explained in the foregoing. For the voltage step-up circuit 6, for example, it is also possible to use a step-up chopper circuit provided with switching devices. Moreover, it is needless to say that also the configurations of the differential amplifier 2 and the inverting amplifier 3 may be modified as required from the basic configurations shown in FIG. 5 and FIG. 6, respectively. Furthermore, it is also possible that the power supply voltage Vdd can be established as being further lower within the range satisfying the operation condition of each of the differential amplifier 2 and the inverting amplifier 3 although this depends on the characteristics of the devices such as the MOS-FETs forming the differential amplifier 2 and the inverting amplifier 3. In addition, the invention can be variously modified to be carried out within the range without departing from the spirit and scope of the invention.

What is claimed is:

1. A differential amplifier circuit comprising:
   a differential amplifier operated with a first power supply voltage applied thereto to amplify a differential voltage between paired input voltages;
   an inverting amplifier operated with an externally supplied second power supply voltage applied thereto to carry out inverting amplification of the output of the differential amplifier and output an amplified output to an output terminal; and
   a voltage step-up circuit producing the first power supply voltage higher than the second power supply voltage and applying the produced first power supply voltage to the differential amplifier,
   the voltage step-up circuit including
   an oscillator receiving the second power supply voltage to carry out an oscillating operation; and
   a charge-pumping circuit receiving the output of the oscillator to produce the first power supply voltage from the second power supply voltage.

2. The differential amplifier circuit as claimed in claim 1 wherein the oscillator is a ring oscillator formed of odd numbers of three or more logical inverter circuits connected in series in a loop and carries out an oscillation operation with the use of the signal transfer characteristic accompanied by the delay in the operation response of each of the logical inverter circuits.

3. The differential amplifier circuit as claimed in claim 1 wherein the charge-pumping circuit comprises:
   a logical inverter circuit having the second power supply voltage applied thereto and carrying out repetitive inverting operations which invert the output of the oscillator to repeatedly output voltages each being approximately equal to the second power supply voltage;
   a first capacitor the one end of which is connected to the output end of the logical inverter circuit;
   a first diode the cathode of which is connected to the other end of the first capacitor to apply the second power supply voltage thereto to make the first capacitor charged to have the voltage across the first capacitor approximately equal to the second power supply voltage;
   a second diode the anode of which is connected to the connection point of the other end of the first capacitor and the first diode; and
   a second capacitor the one end of which is connected to the cathode of the second diode and the other end of which is connected to the ground,
   with the repetitive inverting operations of the logical inverter circuit, the first capacitor the one end of which is connected to the output end of the logical inverter circuit repeatedly transmitting a voltage from the other end thereof to the second capacitor through the second diode, the voltage being approximately two times the second power supply voltage with the output voltages of the logical inverter circuit repeatedly added to the voltage across the charged first capacitor, and
   the second capacitor having the voltage approximately two times the second power supply voltage applied to the one end thereof to be repeatedly charged and producing the voltage approximately two times the second power supply voltage across the second capacitor based on the charging as the first power supply voltage.

4. The differential amplifier circuit as claimed in claim 1 wherein the differential amplifier includes:
   a first transistor forming one of a differential pair to which one of the paired input voltages is inputted;
   a second transistor forming the other one of the differential pair to which the other one of the paired input voltages is inputted;
   a third transistor forming the load of the first transistor;
   a fourth transistor forming the load of the second transistor; and
   a fifth transistor forming the current source of the differential pair.

5. The differential amplifier circuit as claimed in claim 4 wherein each of the first and second transistors forming the differential pair and the fifth transistor is an n-channel enhancement mode MOS-FET and each of the third and fourth transistors is an n-channel depletion mode MOSFET.

* * * * *